(12) United States Patent
Fukagawa et al.

(10) Patent No.: US 11,955,739 B2
(45) Date of Patent: Apr. 9, 2024

(54) CONNECTION STRUCTURE BETWEEN PRINTED CIRCUIT BOARD AND TERMINAL BLOCK, TERMINAL BLOCK, AND AIR CONDITIONER

(71) Applicant: DAIKIN INDUSTRIES, LTD., Osaka (JP)

(72) Inventors: Kazunari Fukagawa, Osaka (JP); Hironori Ogawa, Osaka (JP); Akihiko Oguri, Osaka (JP); Ryuuichi Toyota, Osaka (JP); Natsuko Kitagawa, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 512 days.

(21) Appl. No.: 17/277,579

(22) PCT Filed: Oct. 21, 2019

(86) PCT No.: PCT/JP2019/041346
§ 371 (c)(1),
(2) Date: Mar. 18, 2021

(87) PCT Pub. No.: WO2020/085317
PCT Pub. Date: Apr. 30, 2020

(65) Prior Publication Data
US 2022/0037814 A1 Feb. 3, 2022

(30) Foreign Application Priority Data
Oct. 24, 2018 (JP) ................ 2018-200237

(51) Int. Cl.
*H01R 12/51* (2011.01)
*H01R 4/38* (2006.01)
*H05K 1/11* (2006.01)

(52) U.S. Cl.
CPC ........... *H01R 12/515* (2013.01); *H05K 1/119* (2013.01); *H01R 4/38* (2013.01);
(Continued)

(58) Field of Classification Search
CPC ............... H01R 12/515; H01R 12/523; H01R 12/7047; H01R 4/44; H01R 12/727;
(Continued)

(56) References Cited

U.S. PATENT DOCUMENTS

| 3,488,619 A | 1/1970 | Weld |
| 2011/0177723 A1 | 7/2011 | Kume |

FOREIGN PATENT DOCUMENTS

| CN | 204441502 U | 7/2015 | |
| DE | 102008026772 A1 * | 12/2009 | ......... H01R 12/7047 |

(Continued)

OTHER PUBLICATIONS

Extended European Search Report issued in corresponding European Application No. 19877501.7, dated Jun. 15, 2022 (12 pages).

(Continued)

*Primary Examiner* — Renee S Luebke
*Assistant Examiner* — Paul D Baillargeon
(74) *Attorney, Agent, or Firm* — Osha Bergman Watanabe & Burton LLP

(57) ABSTRACT

A connection structure between a printed circuit board and a terminal block includes: an insertion portion at one end of the printed circuit board with a pattern disposed thereon; a terminal-block main body including a receiving port that receives the insertion portion; a nut held in the terminal-block main body; and a screw tightened into the nut. The pattern is interposed between the screw and the nut when the insertion portion is inserted into the receiving port.

12 Claims, 18 Drawing Sheets

(52) U.S. Cl.
 CPC ............. *H05K 2201/09163* (2013.01); *H05K 2201/10393* (2013.01); *H05K 2201/10409* (2013.01)

(58) Field of Classification Search
 CPC .. H01R 12/712; H01R 12/716; H01R 13/621; H01R 13/6215; H01R 4/38
 See application file for complete search history.

(56) References Cited

FOREIGN PATENT DOCUMENTS

| | | | |
|---|---|---|---|
| FR | 2822014 A1 * | 9/2002 | ........... H01R 12/515 |
| JP | S56-008090 U | 1/1981 | |
| JP | S56-162874 U | 12/1981 | |
| JP | S63-038276 U | 3/1988 | |
| JP | H04-027573 U | 3/1992 | |
| JP | H06-11525 Y2 | 3/1994 | |
| JP | H06-21161 U | 3/1994 | |
| JP | H09-063673 A | 3/1997 | |
| JP | 2006-294537 A | 10/2006 | |
| JP | 2007-234373 A | 9/2007 | |
| JP | 2011-165649 A | 8/2011 | |
| JP | 2013-011430 A | 1/2013 | |

OTHER PUBLICATIONS

International Search Report issued in corresponding International Application No. PCT/JP2019/041346 dated Dec. 17, 2019 (2 pages).
International Preliminary Report on Patentability issued for PCT/JP2019/041346, dated Apr. 27, 2021 (8 pages).

\* cited by examiner

CONNECTION STRUCTURE BETWEEN PRINTED CIRCUIT BOARD AND TERMINAL BLOCK, TERMINAL BLOCK, AND AIR CONDITIONER

TECHNICAL FIELD

The present disclosure relates to a connection structure between a printed circuit board and a terminal block, a terminal block, and an air conditioner including the connection structure.

BACKGROUND

To connect an external electric wire to a printed circuit board, a terminal block is required in a case where the current is relatively large. In order to mount the terminal block on the printed circuit board, for example, the terminal block is screwed to the printed circuit board to connect the pattern and the terminal block with an electric wire, or the terminal block is mounted on the printed circuit board by soldering (for example, refer to Patent Literature 1).

Patent Literature 1: Japanese Unexamined Patent Publication No. 2006-294537

However, connecting the pattern and the terminal block with an electric wire or soldering the terminal block to the printed circuit board is not suitable for automated mounting and thus done manually. This is time-consuming and reduces productivity. Although it is possible to fix the electric wire directly to the pattern with a screw without using the terminal block, an attachment plate of the printed circuit board has a complicated structure in such a case.

SUMMARY

One or more embodiments provide a better structure, from the viewpoint of work efficiency, for attaching a terminal block to a printed circuit board.

(1) A connection structure between a printed circuit board and a terminal block according to one or more embodiments of the present disclosure includes a printed circuit board in which a pattern is drawn out near an end portion serving as an insertion portion, a terminal-block main body having a space serving as a receiving port for the insertion portion, a nut held in the terminal-block main body, and a screw tightened into the nut with the pattern interposed between the screw and the nut while the insertion portion is inserted into the space.

With the connection structure between the printed circuit board and the terminal block as described above, it is possible to provide a better structure, from the viewpoint of work efficiency, for attaching the terminal block to the printed circuit board. The connection structure as described above may also provide benefits from the viewpoints of reliable attachment, cost, and compactness.

Optional configurations will be described in the following (2) to (9).

(2) In the connection structure between a printed circuit board and a terminal block according to (1) described above, a hole may be formed in the pattern, and the screw may be tightened into the nut through the hole.

In this case, the printed circuit board and the terminal block can be reliably fixed to each other.

(3, 4) The connection structure between a printed circuit board and a terminal block according to (1) or (2) described above may further include a conducting plate having a hole through which the screw passes, the conducting plate being in direct contact with the pattern.

In this case, an electric wire can be connected to the terminal block with a core wire or a crimp terminal inserted between the screw and the conducting plate.

(5) In the connection structure between a printed circuit board and a terminal block according to (3) or (4) described above, the conducting plate may be an elastic body that integrally includes, in relation to an axial direction of the screw and an orthogonal direction orthogonal to the axial direction: a first support portion inserted into the terminal-block main body in the axial direction; a conducting portion that extends in the orthogonal direction from a base end portion on an opposite side of a tip end portion of the first support portion inserted into the terminal-block main body, is interposed between the pattern and the nut, folded back in a U shape, and interposed between the pattern and a head of the screw; and a second support portion extending from an end portion of the conducting portion in a direction opposite to an insertion direction of the first support portion.

In this case, it is possible to suppress the detachment of the terminal block even before the screw is tightened.

(6) In the connection structure between a printed circuit board and a terminal block according to (5) described above, a retaining projection may be formed on a side end surface of the first support portion.

In this case, it is possible to suppress the detachment of the conducting plate from the terminal-block main body.

(7) In the connection structure between a printed circuit board and a terminal block according to any of (1) to (4) described above, the terminal-block main body may be provided with an engaging piece that engages with the printed circuit board to prevent the printed circuit board from coming off (i.e., detaching from the terminal block).

In this case, it is possible to prevent the printed circuit board from coming off even before the screw is tightened (temporary fixing).

(8) In the connection structure between a printed circuit board and a terminal block according to any of (1) to (4) described above, a spacer may be provided between the printed circuit board and an installation surface below the printed circuit board, and a height of the spacer may be equal to a height dimension from the installation surface to a lower side of the receiving port (space).

In this case, the force applied to the printed circuit board can be suppressed.

(9) In the connection structure between a printed circuit board and a terminal block according to any of (1) to (4) described above, one of a recess and a protrusion may be formed in the insertion portion of the printed circuit board, and the other one of the recess and the protrusion may be formed at a corresponding position on the terminal-block main body.

This facilitates the positioning at the time of inserting the terminal block into the printed circuit board.

(10) From the viewpoint of a terminal block to be connected to a printed circuit board in which a pattern is drawn out near an end portion serving as an insertion portion, the terminal block includes a terminal-block main body having a space serving as a receiving port for the insertion portion, a nut held in the terminal-block main body, and a screw tightened into the nut with the pattern interposed between the screw and the nut while the insertion portion is inserted into the space.

With the terminal block as described above, it is possible to provide a terminal block having a better structure, from the viewpoint of work efficiency, for attaching the terminal block to the printed circuit board. The terminal block as described above may also provide benefits from the viewpoints of reliable attachment, cost, and compactness.

(11) From the viewpoint of an air conditioner in which a terminal block for connecting an electric wire is connected to a printed circuit board, the air conditioner includes, as a connection structure between the printed circuit board and the terminal block: the printed circuit board in which a pattern is drawn out near an end portion serving as an insertion portion; a terminal-block main body having a space serving as a receiving port for the insertion portion; a nut held in the terminal-block main body; and a screw tightened into the nut with the pattern interposed between the screw and the nut while the insertion portion is inserted into the space.

With the air conditioner as described above, it is possible to provide a better structure, from the viewpoint of work efficiency, for attaching the terminal block to the printed circuit board. The connection structure in the air conditioner as described above may also provide benefits from the viewpoints of reliable attachment, cost, and compactness.

DETAILED DESCRIPTION

<<Air Conditioner>>

Embodiments of the present disclosure will be described below.

Figure 18:
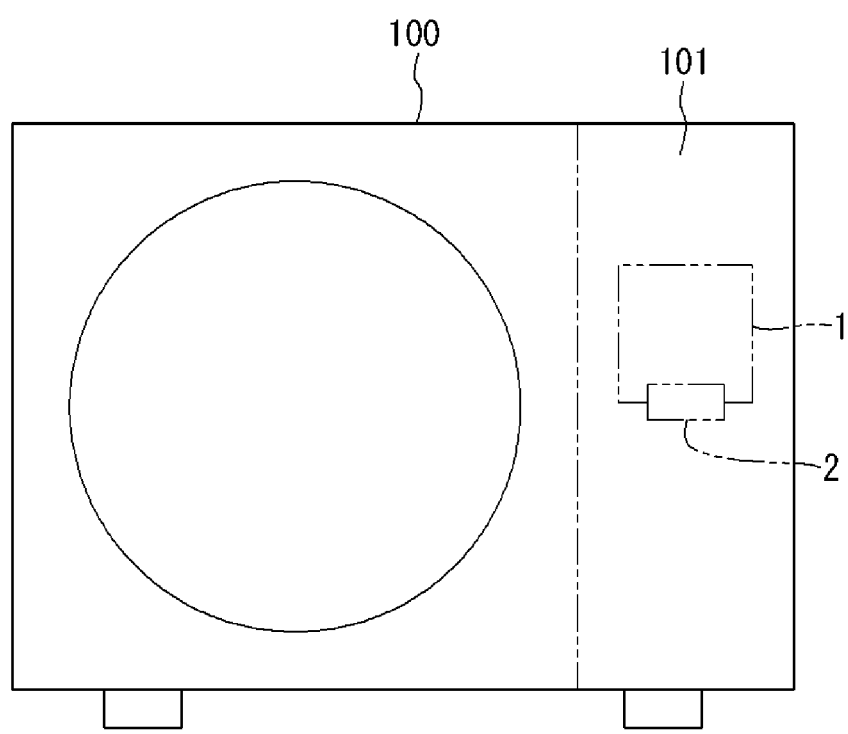
FIG. 18 is a schematic diagram illustrating an electric component room of an air conditioner.

FIG. 18 is a schematic diagram illustrating, for example, an electric component room 101 of an air conditioner 100. In the figure, a printed circuit board 1 is housed in the electric component room 101 of the air conditioner 100. A terminal block 2 is mounted on the printed circuit board 1, and a cable (not illustrated) is connected to the terminal block 2 from the outside.

<<Terminal Block>>

Figure 1:
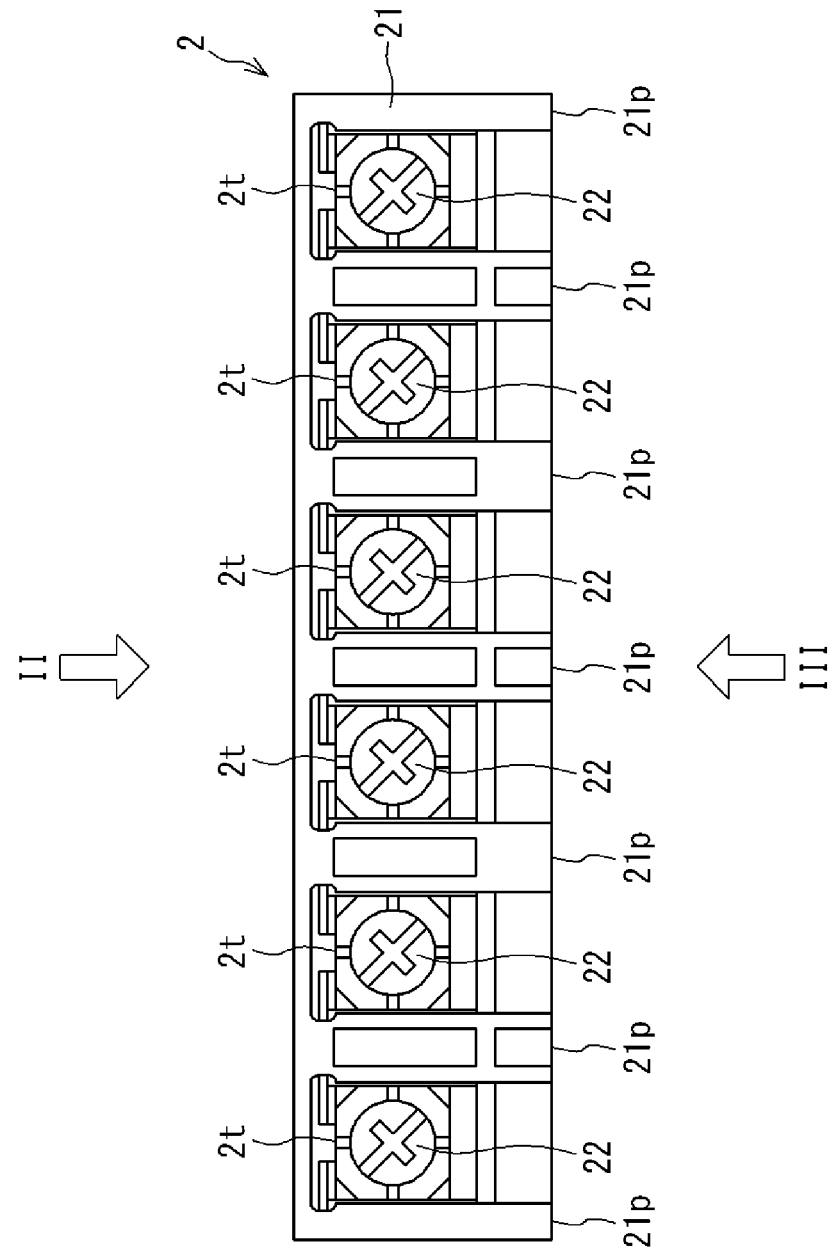
FIG. 1 is a plan view illustrating an exemplary terminal block.

FIG. 1 is a plan view illustrating an example of the terminal block 2. In the figure, the terminal block 2 includes, for example, six (six pieces of) terminals 2t arranged with both sides protected by partition walls 21p for insulation. The terminal block 2 includes, for example, a terminal-block main body 21 made of polybutylene terephthalate resin, a screw 22 with a square washer, and a nut (not visible in the plan view) to be fastened to the screw 22.

Figure 2:
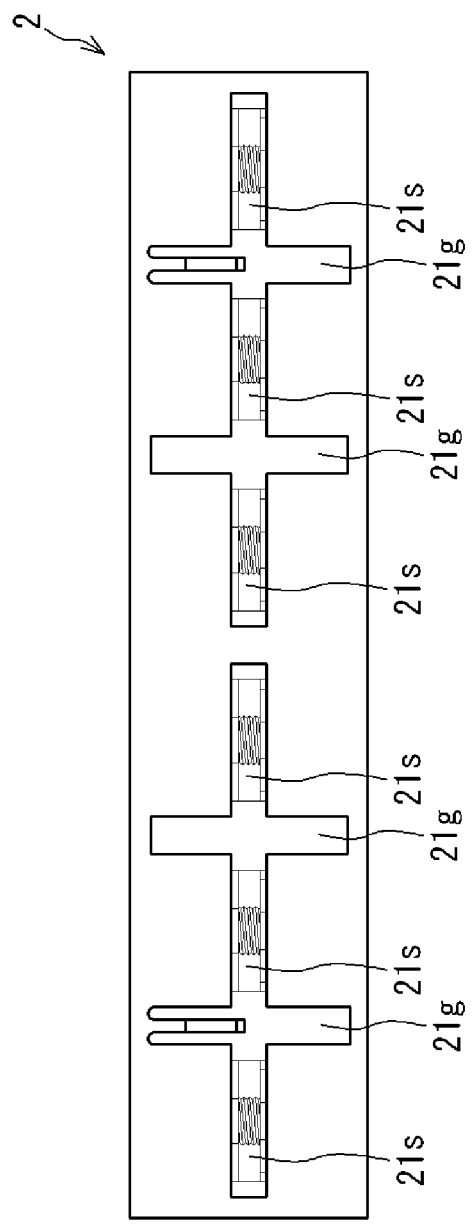
FIG. 2 illustrates the terminal block as viewed from the side where a printed circuit board is inserted.

FIG. 2 illustrates the terminal block 2 as viewed from the side where the printed circuit board 1 is inserted (the side of arrow II in FIG. 1). In the figure, an elongated space 21s, into which an insertion portion of the printed circuit board 1 is inserted, is formed in the middle of the terminal block 2 in the height direction (up-down direction in the figure). The insertion portion will be described later. The space 21s is provided for each terminal 2t (FIG. 1) and, in the case of FIG. 2, the spaces 21s communicate with each other over three terminals 2t adjacent to each other. The communicating spaces 21s extend such that the right-left direction thereof corresponds to the longitudinal direction, and a plurality of (in this example, two) sets of communicating spaces 21s is formed side by side in the right-left direction in the whole terminal block 2. In other words, the three spaces 21s on the left side communicate with each other horizontally, and the three spaces 21s on the right side communicate with each other horizontally. A vertical groove 21g is for attaching an engaging piece described later, or for reducing the thickness of the partition wall 21p to save the resin material.

Figure 3:
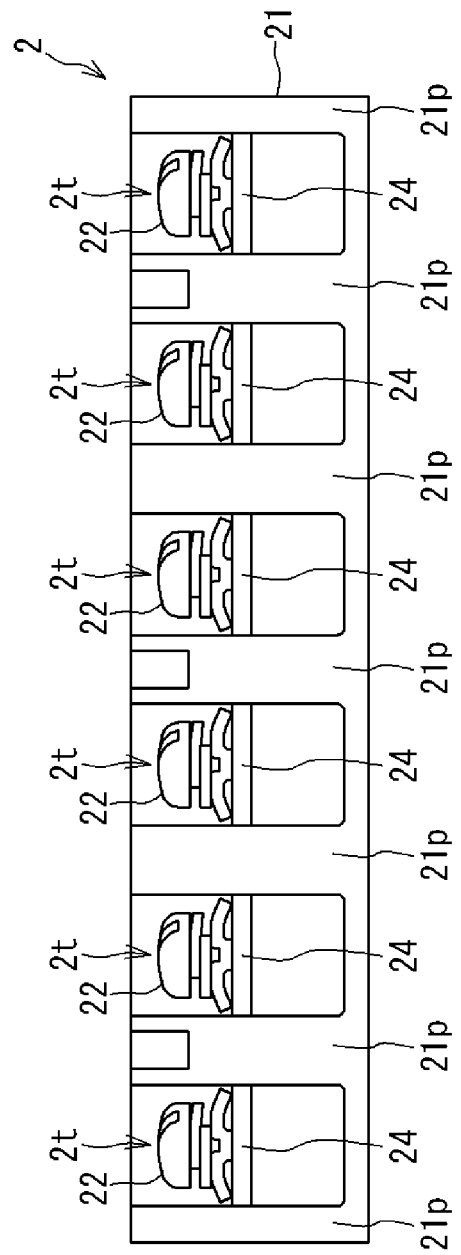
FIG. 3 illustrates the terminal block as viewed from the opposite side of FIG. 2.

FIG. 3 illustrates the terminal block 2 as viewed from the opposite side of FIG. 2 (the side of arrow III in FIG. 1). In the figure, the conducting plates 24 are each partially visible under the screws 22.

Figure 4:
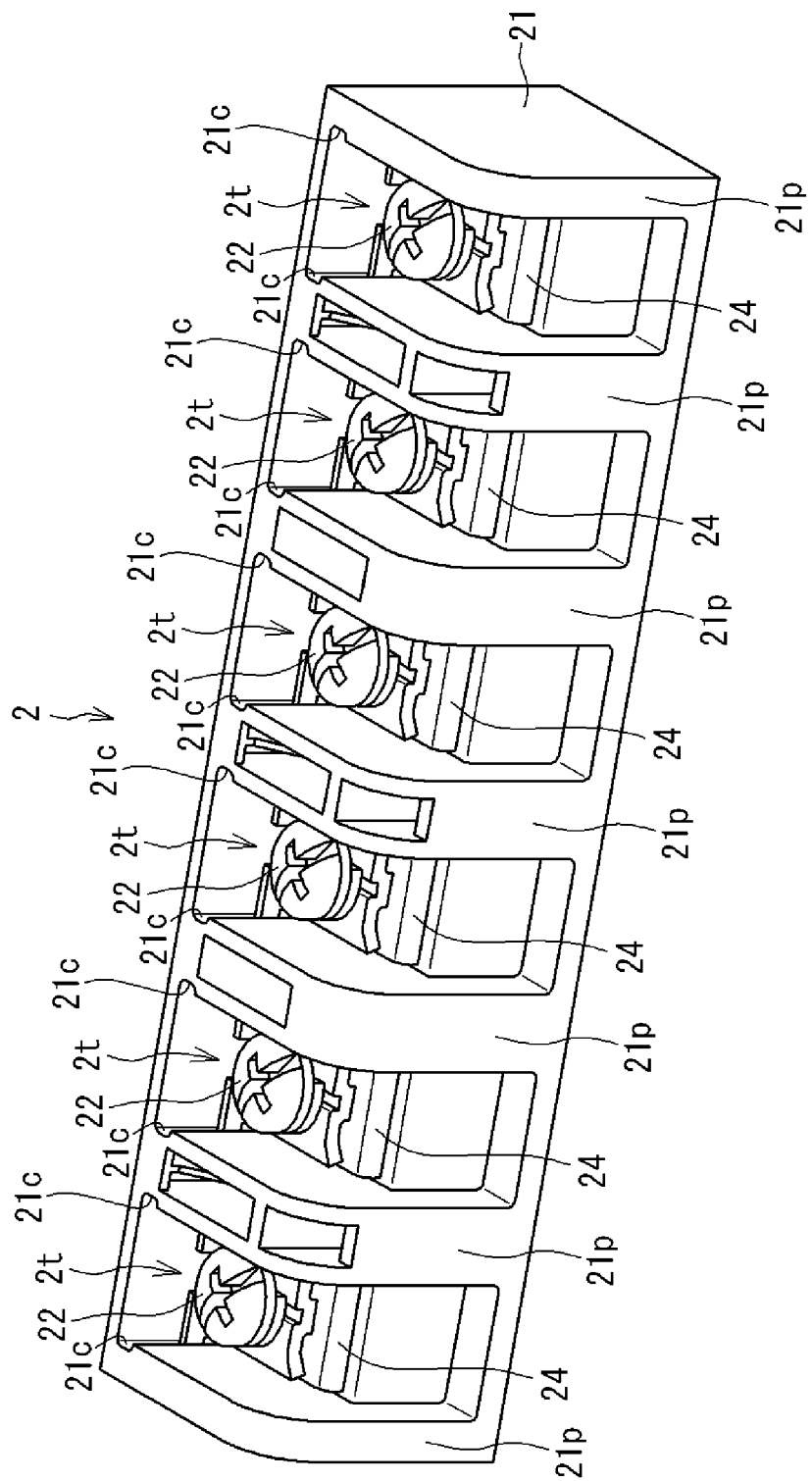
FIG. 4 is a perspective view of the terminal block.

FIG. 4 is a perspective view of the terminal block 2. With the screws 22 attached, conducting plates 24 under the screws 22 are each slightly visible. The width of one terminal 2t excluding the partition wall 21p becomes slightly larger in the right-left direction at the innermost part where a recess 21c is formed. A part of the conducting plate 24 (projections 24e and 24f described later) is fitted into the recess 21c.

Figure 5:
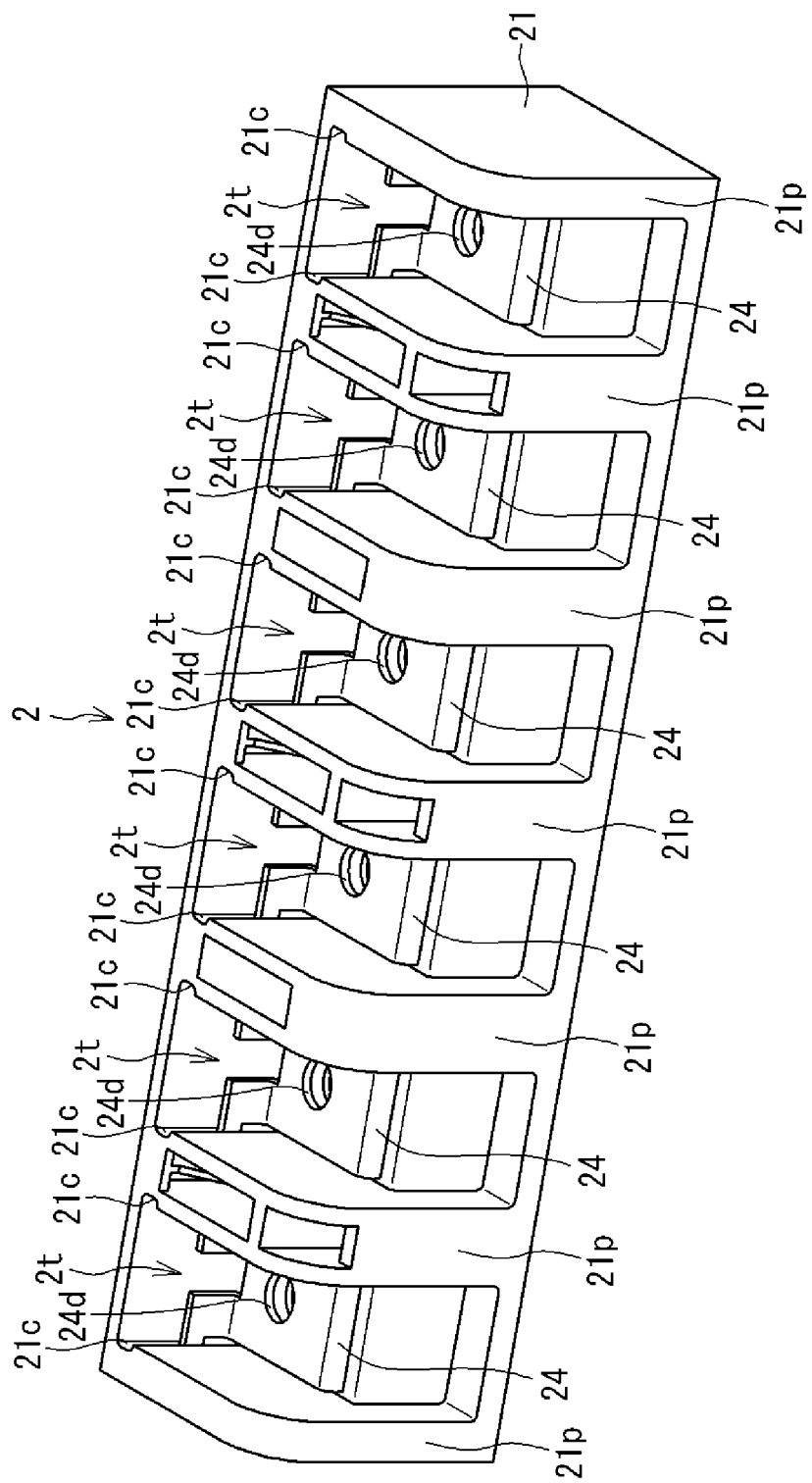
FIG. 5 is a perspective view of the terminal block from which screws have been removed.

FIG. 5 is a perspective view of the terminal block 2 from which all the screws 22 have been removed. With all the screws 22 removed, the upper half of each conducting plate 24 is visible. The conducting plates 24 each have a hole (through hole) 24d through which the screw 22 passes. The printed circuit board 1 can be inserted in the state of FIG. 5 since the screw 22 does not interfere with the insertion.

<<Printed Circuit Board>>

Figure 6:
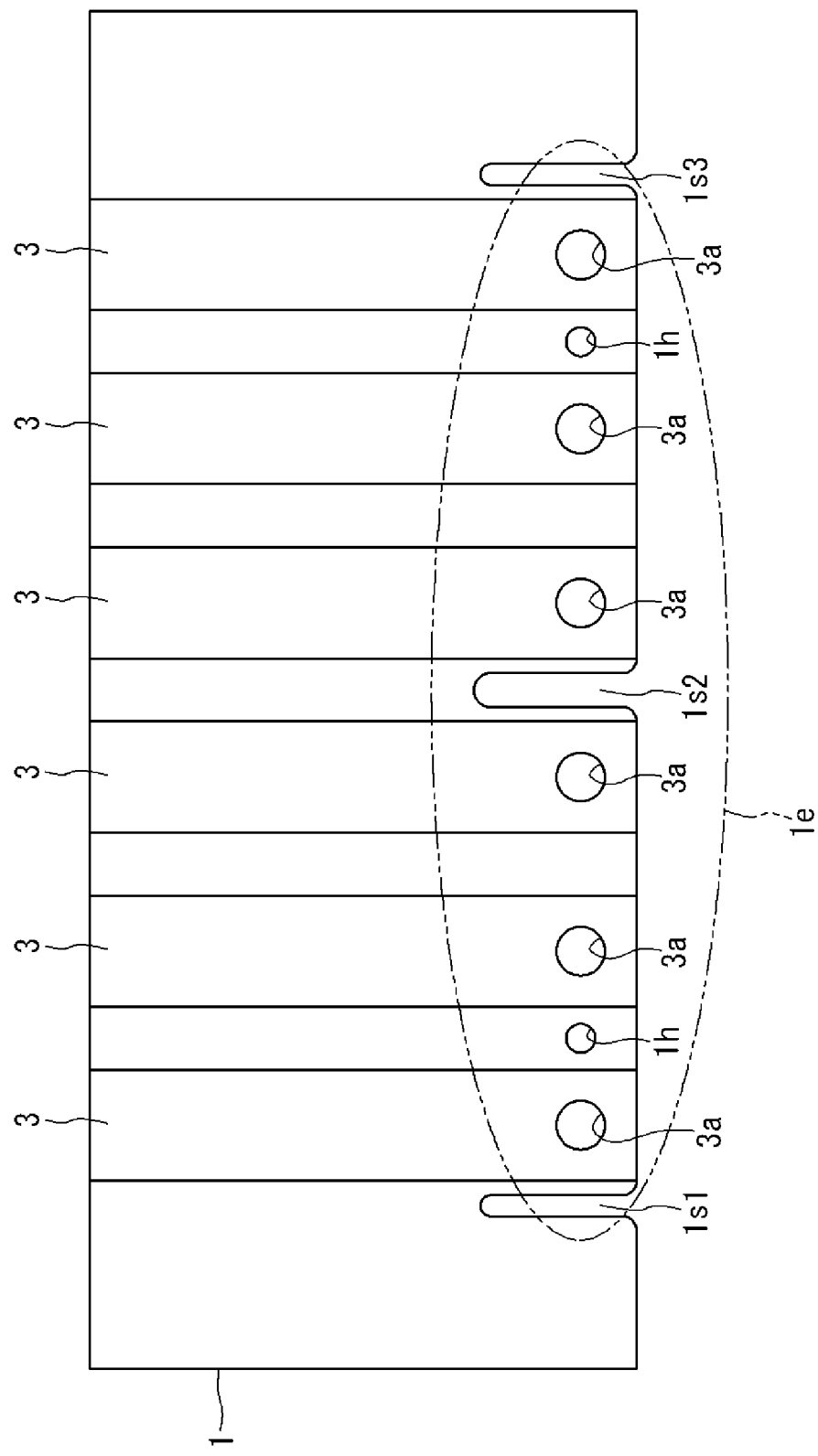
FIG. 6 is a plan view illustrating only a part of the printed circuit board, including the vicinity of an end portion of the printed circuit board.

FIG. 6 is a plan view illustrating only a part of the printed circuit board 1, including the vicinity of an end portion of the printed circuit board 1. In the figure, the printed circuit board 1 normally having a rectangular shape includes an insertion portion 1e at the edge of one side. The insertion portion 1e includes, for example, a plurality of (in this case, six) patterns 3 drawn out (derived) from a circuit (not illustrated) on the printed circuit board 1. The patterns 3 are provided side by side in the insertion portion 1e. A hole 3a (through hole) is formed near the end of each pattern 3. The insertion portion 1e is inserted into the terminal block 2. The screw 22 passes through the hole 3a in the pattern 3. Positioning slits 1s1, 1s2, and 1s3 are formed at three locations on the printed circuit board 1 where the pattern 3 is not provided. The printed circuit board 1 also has a pair of holes (through holes) 1h for temporarily fixing the printed circuit board 1 when the printed circuit board 1 is inserted into the terminal block 2.

<<Connection Structure>>

Figure 7:
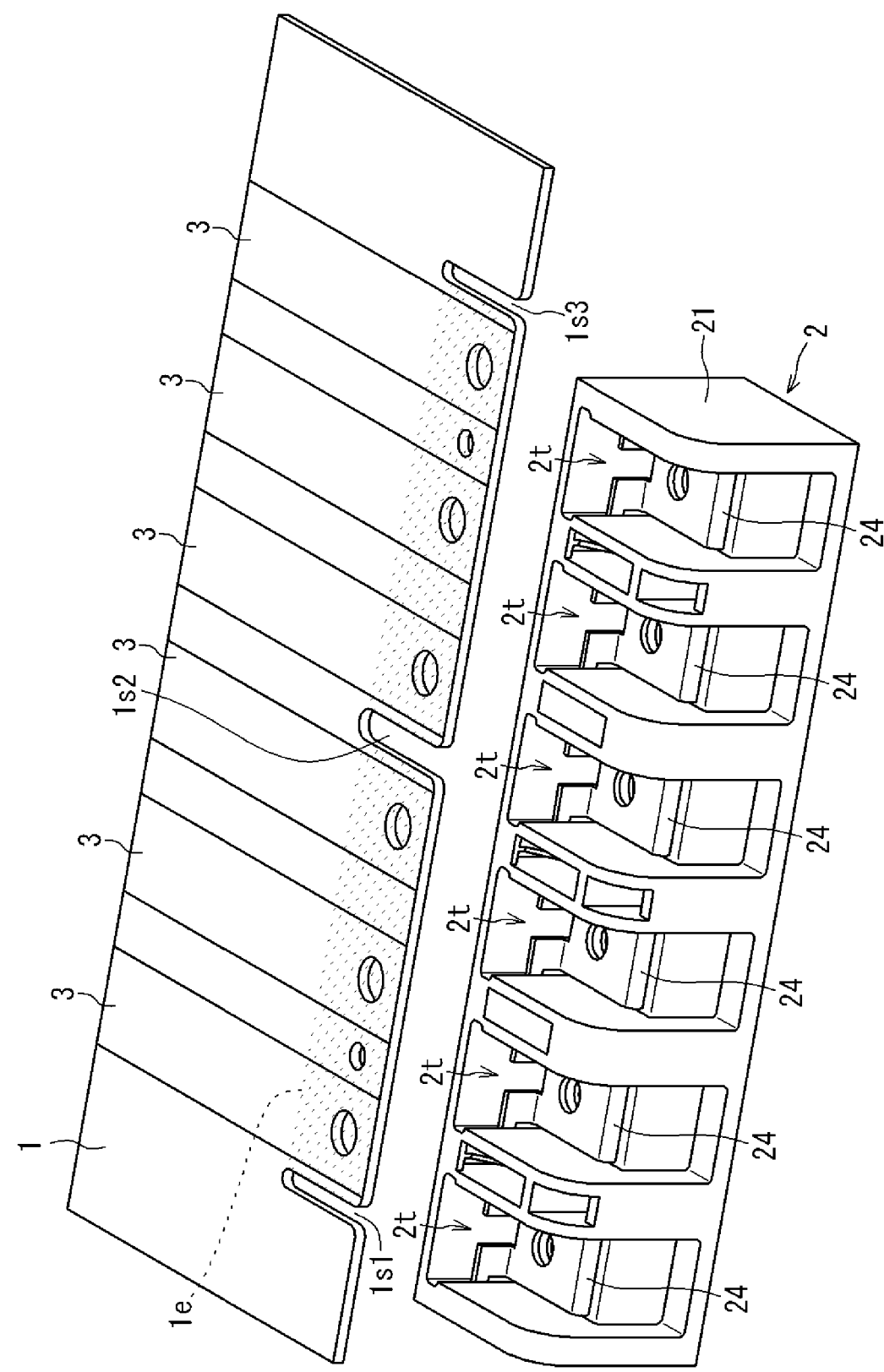
FIG. 7 is a perspective view illustrating the terminal block, from which all the screws have been removed, before being mounted on the printed circuit board.
Figure 8:
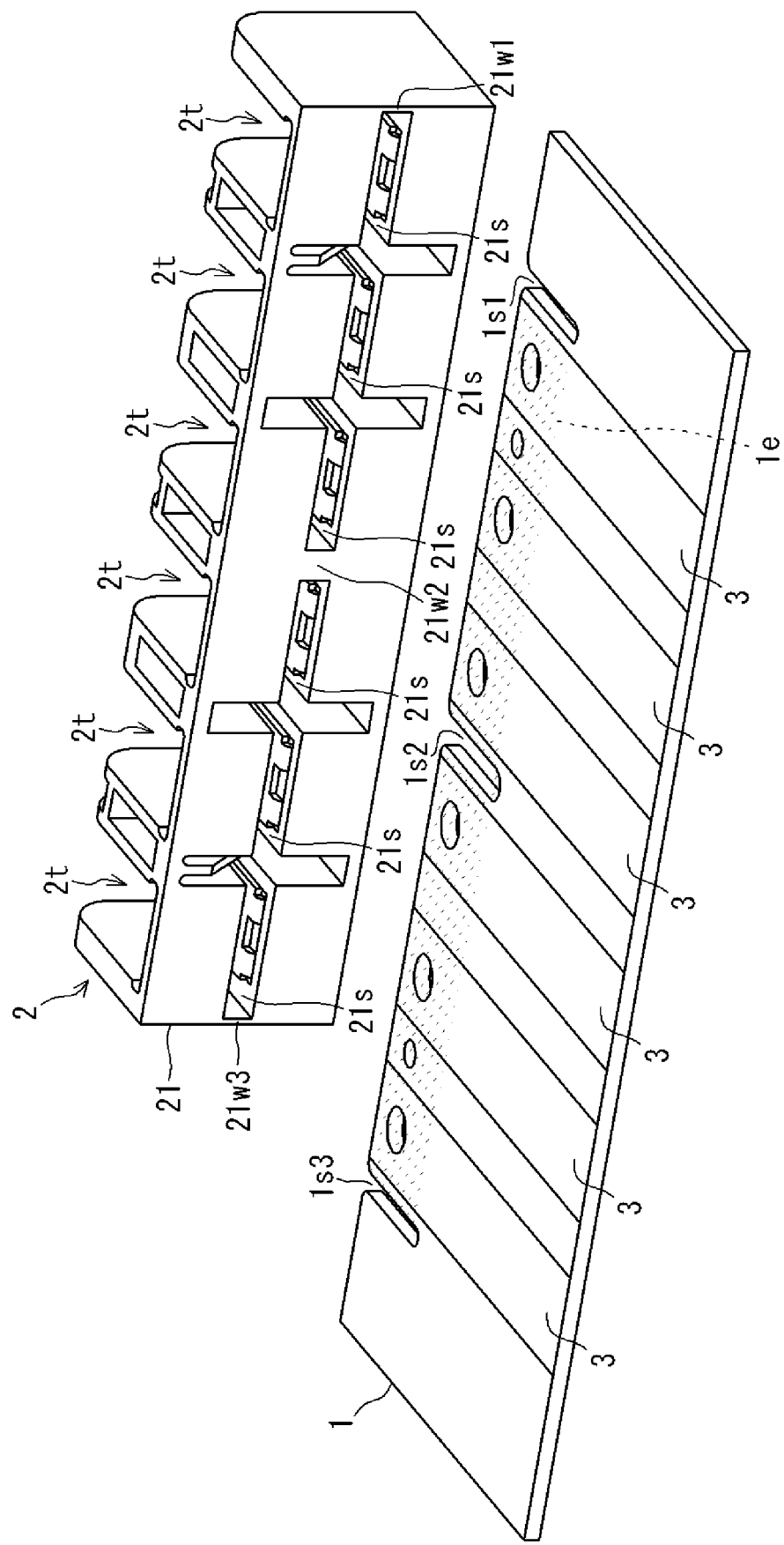
FIG. 8 is a perspective view of the state of FIG. 7 as viewed from the opposite side (from the side of the printed circuit board).

FIG. 7 is a perspective view illustrating the terminal block 2, from which all the screws have been removed, before being mounted on the printed circuit board 1. FIG. 8 is a perspective view of the state at this time as viewed from the opposite side (from the side of the printed circuit board 1). In FIG. 7 and FIG. 8, the insertion portion 1e (dotted hatched area) ranging from the slit 1s1 to the slit 1s3 of the printed circuit board 1 is inserted into the spaces 21s of the terminal-block main body 21, the spaces 21s each serving as a receiving port.

In FIG. 8, there are two sets of the spaces 21s as described above, divided by side walls 21w1 and 21w3 remaining on both sides of the terminal-block main body 21 and a central wall 21w2 remaining at the center of the terminal-block main body 21. First, the side walls 21w1 and 21w3 and the central wall 21w2 are positioned relative to the slits 1s1 to 1s3 of the printed circuit board 1 so as to enter the slits 1s1 and 1s3 and the slit 1s2, respectively. Then, the terminal-block main body 21 is pressed against the printed circuit board 1 to the end such that the insertion portion 1e is inserted into the spaces 21s. As a result, both components are inserted into each other.

Figure 9:
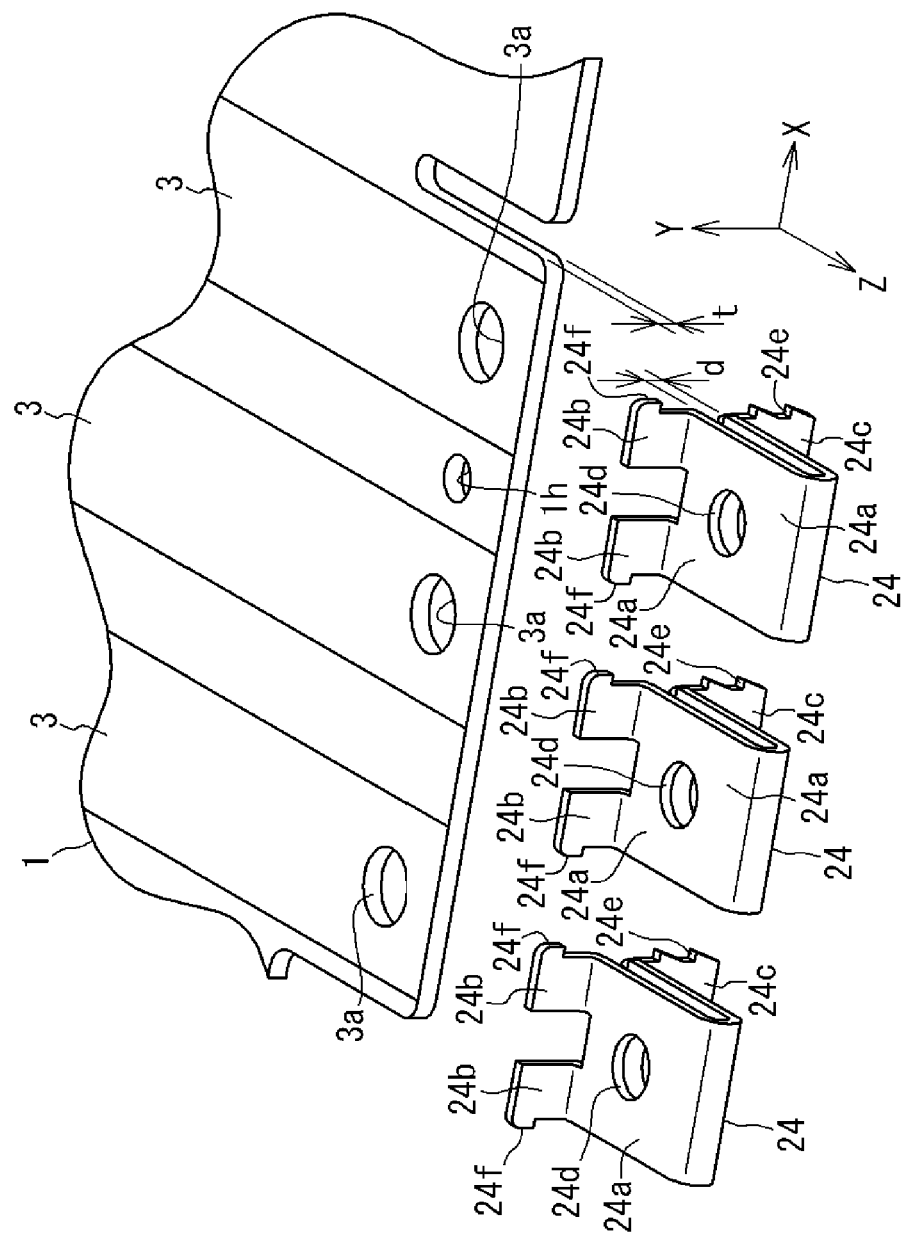
FIG. 9 is a perspective view focused on conducting plates.

FIG. 9 is a perspective view focused on the conducting plates 24. The conducting plate 24 is not only a conducting member that comes in direct contact with the pattern 3, but also a protective member that prevents twisting torque, caused by tightening of the screw 22, from being directly applied to the pattern 3. The conducting plate 24 has a curved shape with bent portions opening toward the pattern 3. This shape may smoothly receive the pattern 3 to be inserted into the conducting plate 24.

The conducting plate 24 is integrally formed substantially in a U shape when viewed from the side in the X direction of the orthogonal coordinate system in the figure. Copper or phosphor bronze may be the material of the conducting plate 24, which is an elastic body. The conducting plate 24 functionally has two folded conducting portions 24a and support portions 24b and 24c extending in the Y direction. The conducting portion 24a is parallel to the pattern 3 and the XZ plane, and has a hole 24d having substantially the same diameter as the hole 3a in the pattern 3. A gap d in the Y direction between the upper and lower conducting portions 24a is, for example, equal to or slightly smaller than a thickness t of the pattern 3. With such a gap size, it is possible to give a certain inserted feeling when the pattern 3 is inserted, and to prevent the terminal block 2 from falling off even before the screw 22 is tightened.

For example, a two-stage projection 24e protruding in the X direction is formed on each of both end faces of the lower support portion 24c in the X direction. The recess 21c (FIG. 4) described above is elongated in the Y direction of FIG. 9, and the width of the recess 21c in the X direction is narrower at the bottom (lower side in FIG. 4) than at the entrance (upper side in FIG. 4). The conducting plate 24 can be attached with the lower projections 24e and the upper projections 24f aligned with and inserted into the recess 21c from above. The lower projections 24e of the attached conducting plate 24 are pressed against (bite into) the narrowed bottom surface of the recess 21c extending in the X direction, making it difficult for the conducting plate 24 to come off in the Y direction. The upper support portion 24b is divided into two pieces, each of which includes the projection 24f protruding outward in the X direction. The projection 24f is fitted into the recess 21c to support the conducting plate 24 such that the conducting plate 24 does not move in the X or Z direction.

Although not illustrated in FIG. 9, a nut 23 (FIG. 10) is provided so as to be in contact with the lower part of the conducting portion 24a on the lower side in the Y direction. The nut 23 is held in, for example, a hexagonal holding hole provided in the terminal-block main body 21 at each of the terminals 2t.

Figure 10:
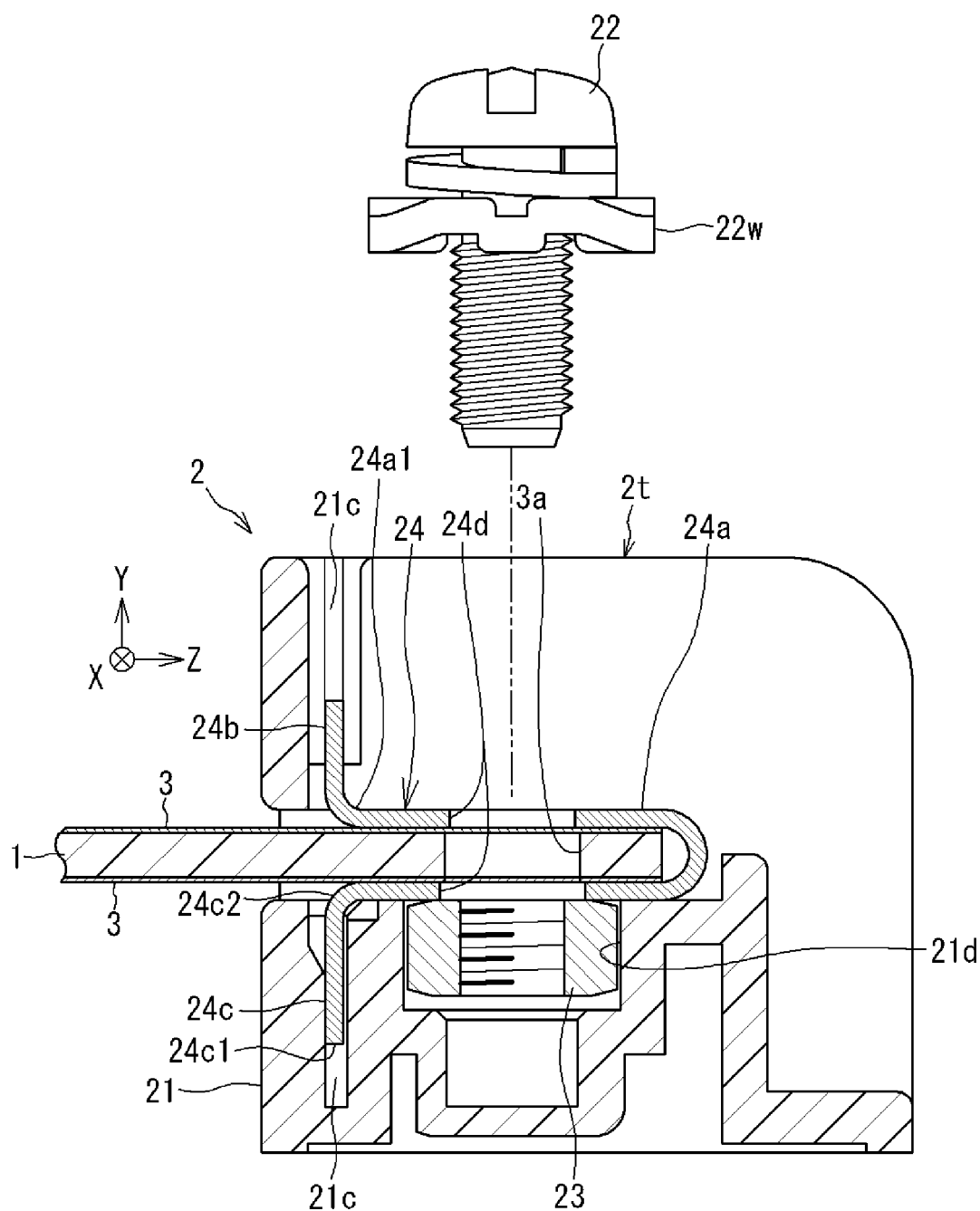
FIG. 10 is a cross-sectional view of one terminal of the terminal block on which the printed circuit board is mounted.

FIG. 10 is a cross-sectional view of one terminal 2t of the terminal block 2 mounted on the printed circuit board 1. As described above, the nut 23 is held in the holding hole 21d of the terminal-block main body 21. The conducting plate 24 is stably supported by the terminal-block main body 21 with the support portions 24c and 24b fitted into or engaged with the recess 21c. The insertion portion 1e (FIGS. 7 and 8) of the printed circuit board 1 is inserted into the conducting plate 24. The screw 22 has a square washer 22w. The printed circuit board 1 and the terminal block 2 are firmly fixed to each other by the screw 22 being tightened into the nut 23. The core wire or crimp terminal of an external electric wire (not illustrated) is connected and fixed between the square washer 22w of the screw 22 and the conducting plate 24.

Here, the shape of the conducting plate 24 will be described in a little more detail with reference to the orthogonal XYZ coordinates in the figure. The conducting plate 24 is an elastic body in which the following portions (a), (b), and (c) are integrally formed with each other, in relation to the axial direction of the screw 22 (Y direction) and the orthogonal direction orthogonal to the axial direction of the screw 22 (direction parallel to the XZ plane).

(a) The first support portion 24c inserted into the terminal-block main body 21 in the axial direction (−Y direction);

(b) the conducting portion 24a that extends in the orthogonal direction (Z direction) from a base end portion 24c2 on the opposite side of a tip end portion 24c1 of the first support portion 24c inserted into the terminal-block main body 21, is interposed between the pattern 3 and the nut 23, folded back in a U shape in the -Z direction, and interposed between the pattern 3 and the head of the screw 22; and (c) the second support portion 24b extending from an end portion 24a1 of the conducting portion 24a in a direction (Y direction) opposite to the insertion direction of the first support portion 24c.

Figure 11:
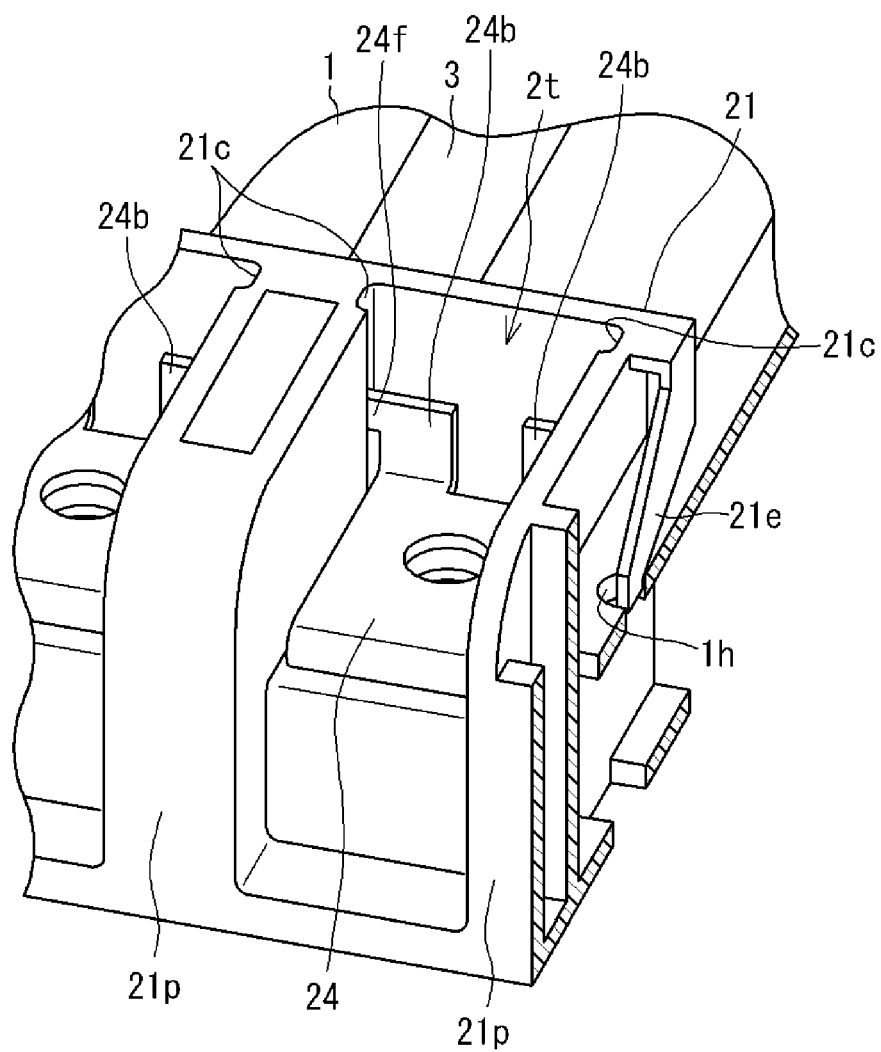
FIG. 11 is a perspective view as well as a partial cross-sectional view illustrating an exemplary retaining structure provided inside a partition wall.

FIG. 11 is a perspective view as well as a partial cross-sectional view illustrating an exemplary retaining structure provided inside the partition wall 21p. Such a retaining structure is provided in a part of the partition wall 21p. Even before the screw 22 is tightened, the contact between the conducting plate 24 and the insertion portion 1e of the printed circuit board 1 suppresses, to some extent, easy separation between the printed circuit board 1 and the terminal block 2, but this configuration of exemplary temporary fixing suppresses the separation more reliably.

In the figure, there is provided a resin engaging piece 21e extending diagonally downward from the upper part of the terminal-block main body 21. The engaging piece 21e exhibits appropriate elasticity in the vertical direction. The lower end of the engaging piece 21e is naturally inserted into the hole 1h of the printed circuit board 1 that has been inserted to a predetermined position. Therefore, the inserted printed circuit board 1 cannot easily be removed unless it is strongly pulled out. This can make the state of temporary fixing more reliable, even before the screw 22 is tightened. Such engaging pieces 21e just need to be provided, for example, in the leftmost and rightmost partition walls 21p among the five partition walls 21p other than the partition walls 21p on both ends illustrated in FIG. 4.

Figure 12:
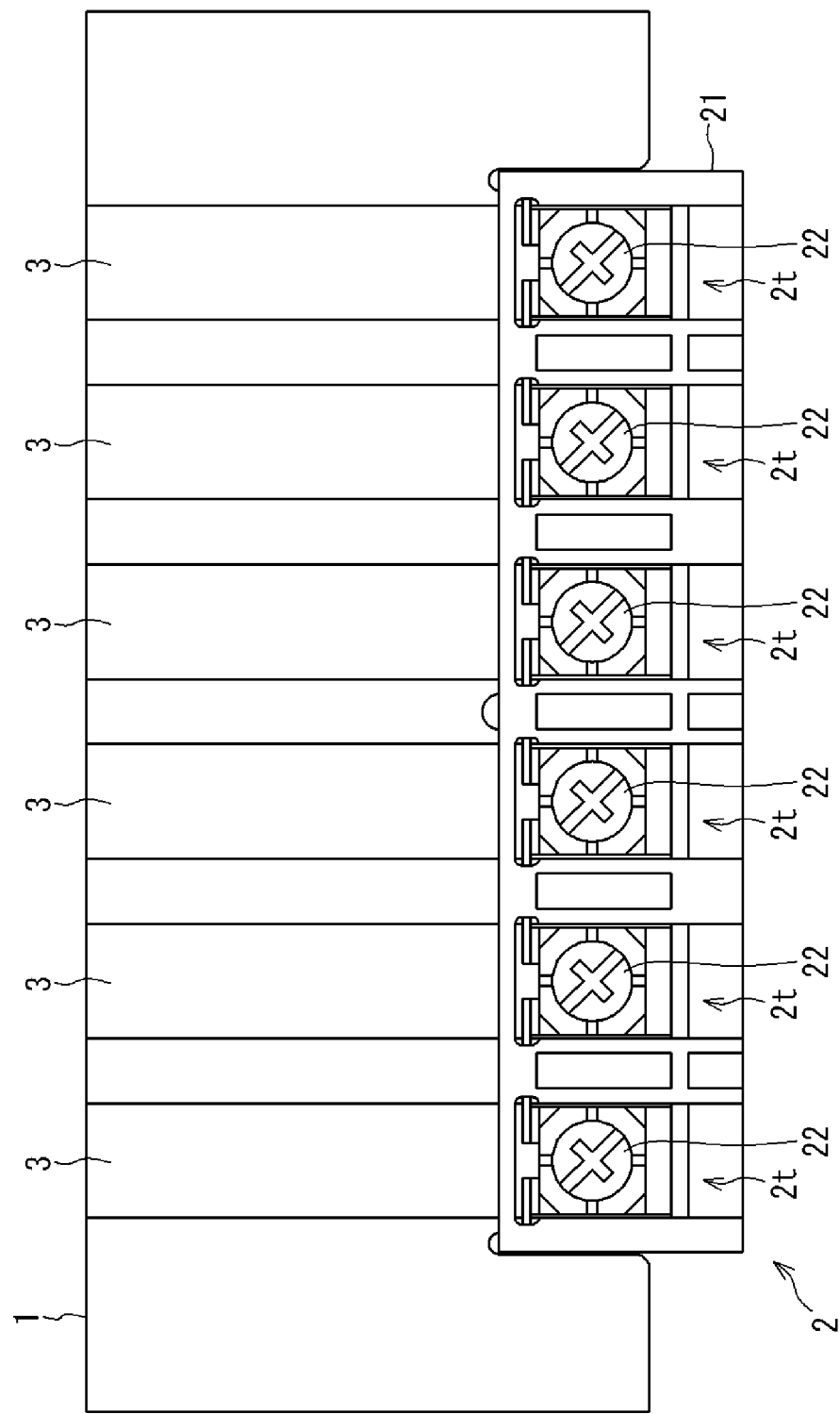
FIG. 12 is a plan view illustrating the printed circuit board and the terminal block that have been connected.
Figure 13:
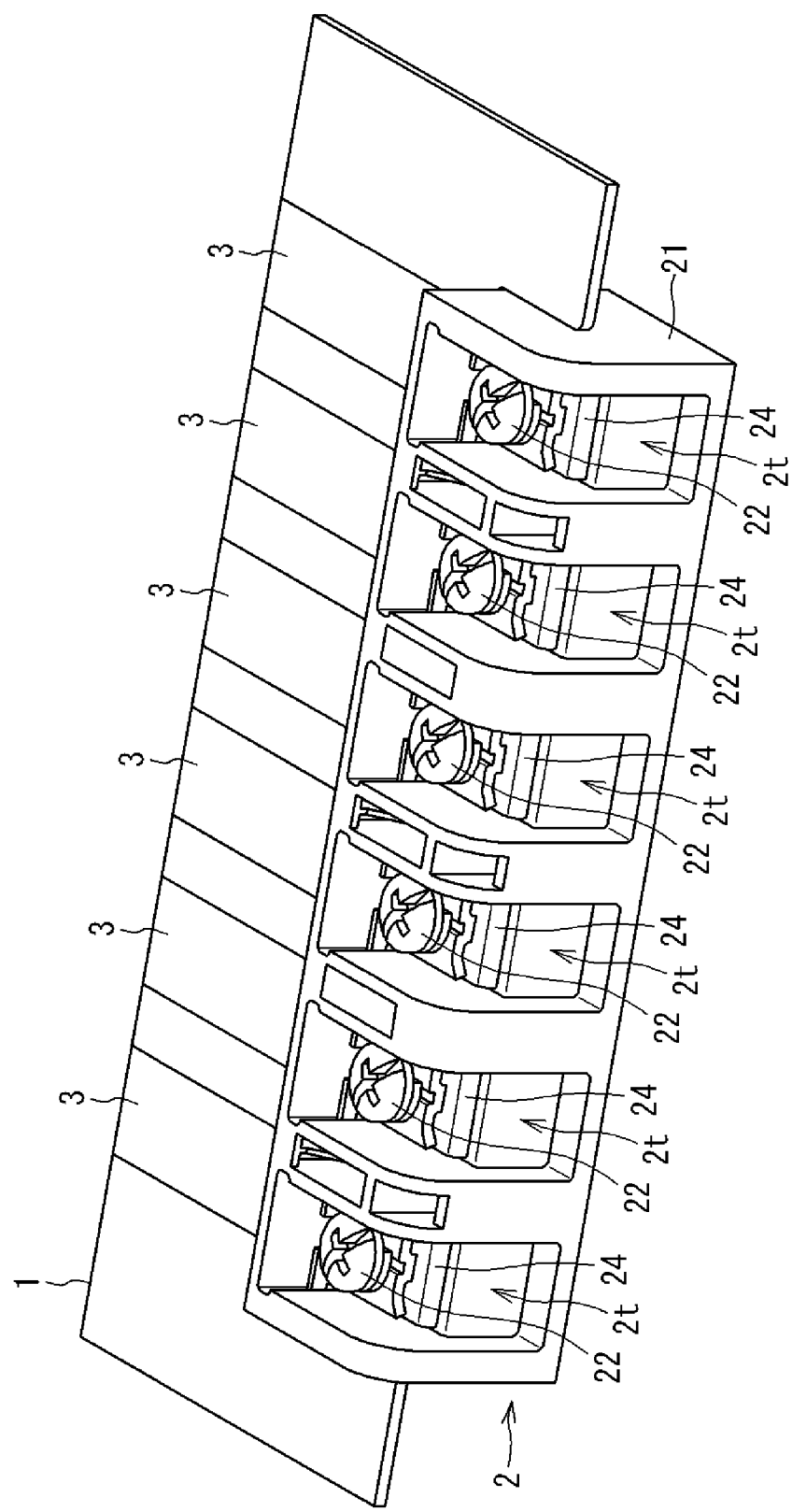
FIG. 13 is a perspective view illustrating the printed circuit board and the terminal block that have been connected.
Figure 14:
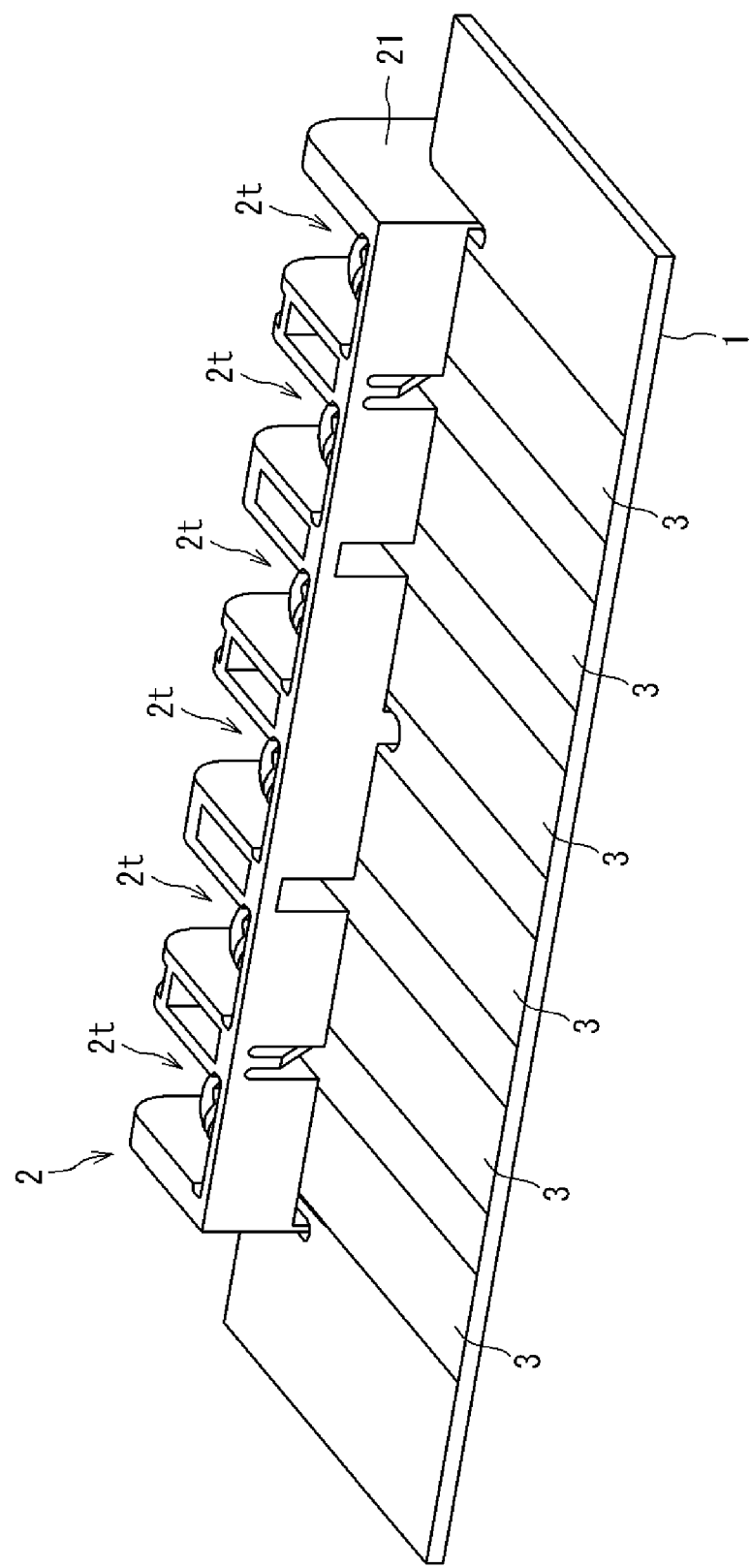
FIG. 14 is a perspective view illustrating the printed circuit board and the terminal block that have been connected, as viewed from the side of the printed circuit board.

FIG. 12 and FIG. 13 are a plan view and a perspective view, respectively, illustrating the printed circuit board 1 and the terminal block 2 that have been connected. FIG. 14 is a perspective view illustrating the printed circuit board 1 and the terminal block 2 that have been connected, as viewed from the side of the printed circuit board. In each figure, each of the terminals 2t is electrically well connected to the end portion of the corresponding pattern 3 by the screw 22 being tightened. As described above, with this connection structure, the terminal block 2 is simply inserted into and screwed to the printed circuit board 1, thus making the installation easy and the soldering process unnecessary. Since soldering is not required, it is not necessary to select, as the resin for the terminal-block main body 21, an expensive resin having sufficient heat resistance against the heat of solder. Since the entire terminal block is not mounted on the printed circuit board 1, the space for the terminal block on the printed circuit board 1 is reduced, making the entire printed circuit board 1 compact.

Figure 15:
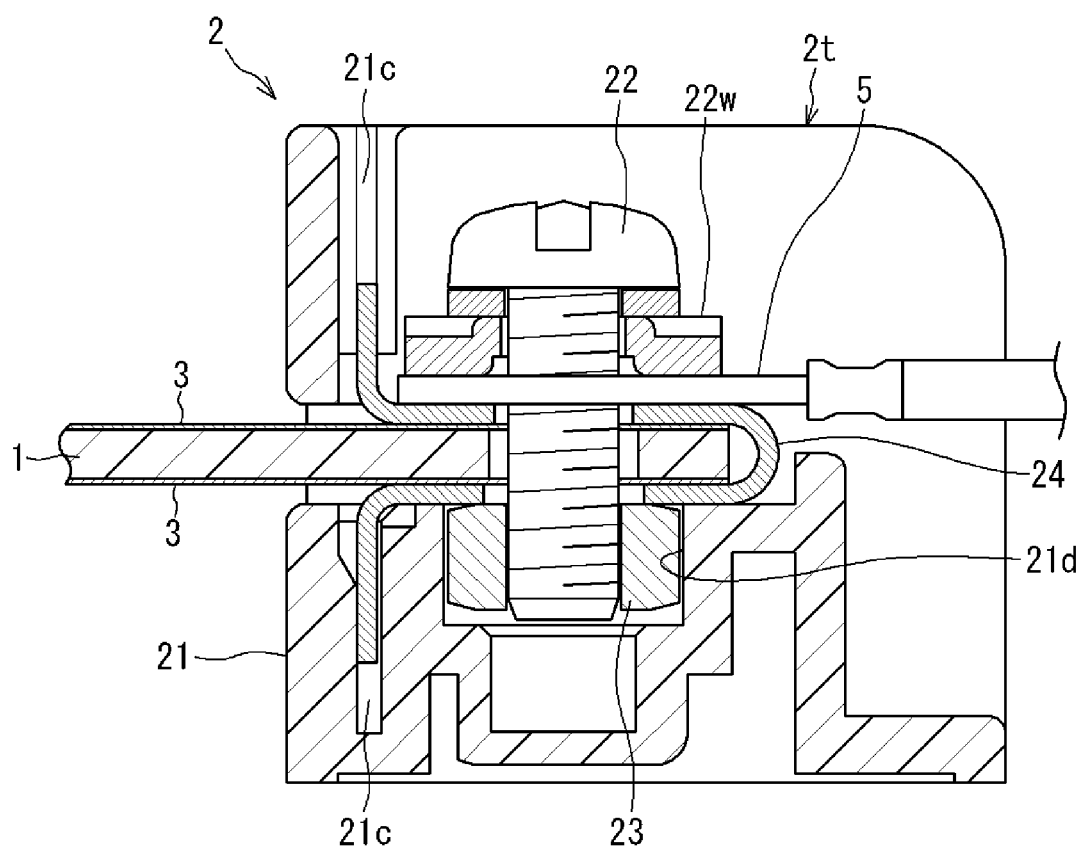
FIG. 15 is an exemplary view illustrating a crimp terminal of an electric wire that is connected to the terminal block.

FIG. 15 is an exemplary view illustrating, for example, a crimp terminal 5 of an electric wire that is connected to the terminal block 2. The pattern 3, the conducting plate 24, and the crimp terminal 5 can be reliably fixed to each other by the screw 22 being tightened. The square washer 22w may be used for direct connection of the core wire of an electric wire without a crimp terminal.

Figure 16:
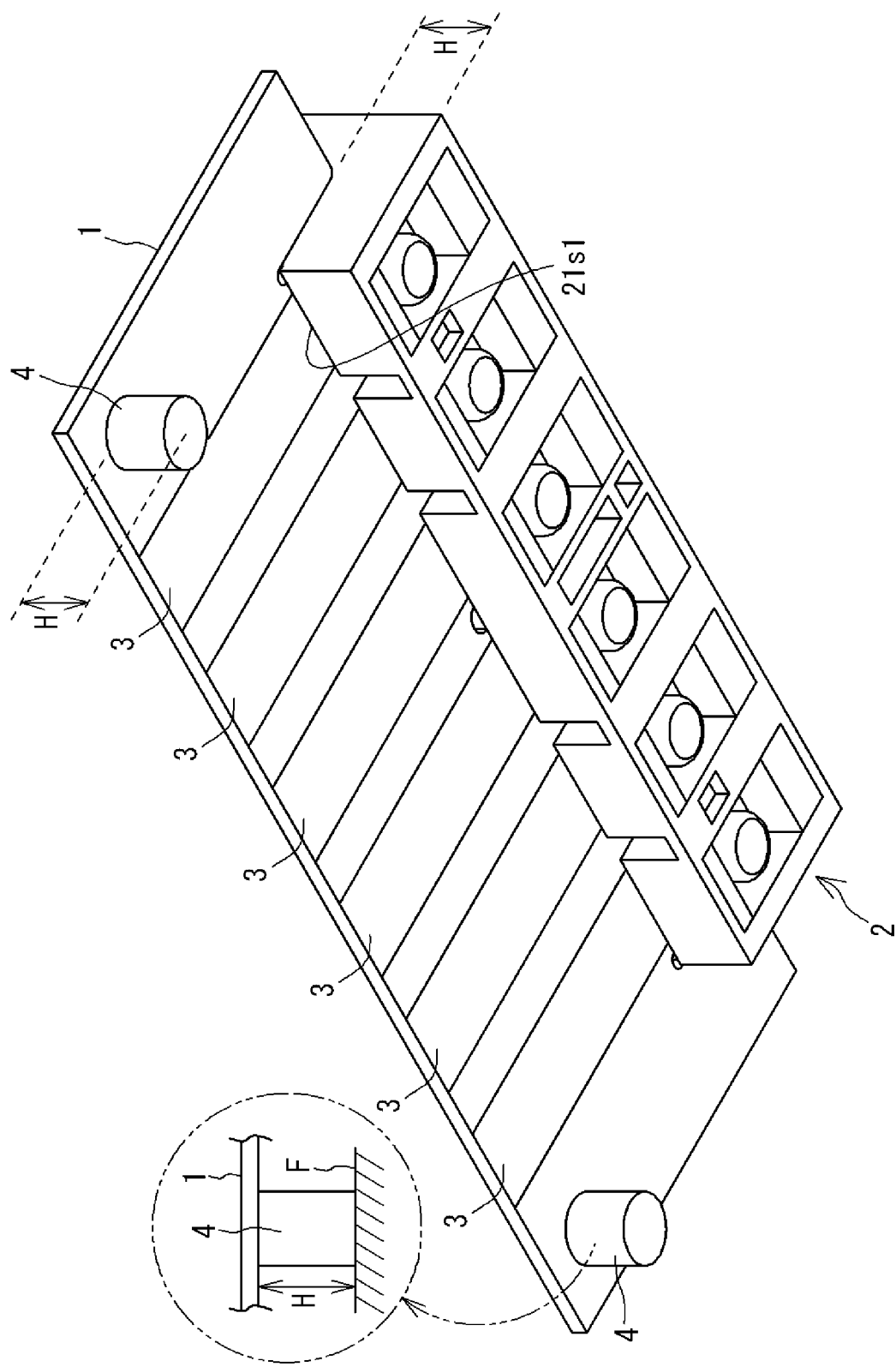
FIG. 16 is a perspective view illustrating an exemplary structure in which a spacer is provided between the printed circuit board and a surface on which the printed circuit board is installed.

FIG. 16 is a perspective view illustrating an exemplary structure in which a spacer 4 is provided between the printed circuit board 1 seen from the rear side and an installation surface F on which the printed circuit board 1 is installed. The inset view surrounded by the alternate long and two short dashes line in the figure is a side view illustrating the installation surface F. In the case where the spacer 4 is provided between the printed circuit board 1 and the installation surface F, the height H of the spacer 4 may be equal to the clearance dimension H between the installation surface and the printed circuit board 1 inserted into the terminal block 2. In other words, the height of the spacer 4 is equal to the height dimension from the installation surface F to a lower side 21s1 of the receiving port (space 21s).

In this case, even if the screw 22 is pushed and turned to connect an electric wire to the terminal block 2, the force applied to the printed circuit board 1 can be suppressed.

<<Other Examples of Printed Circuit Board>>

Figure 17:
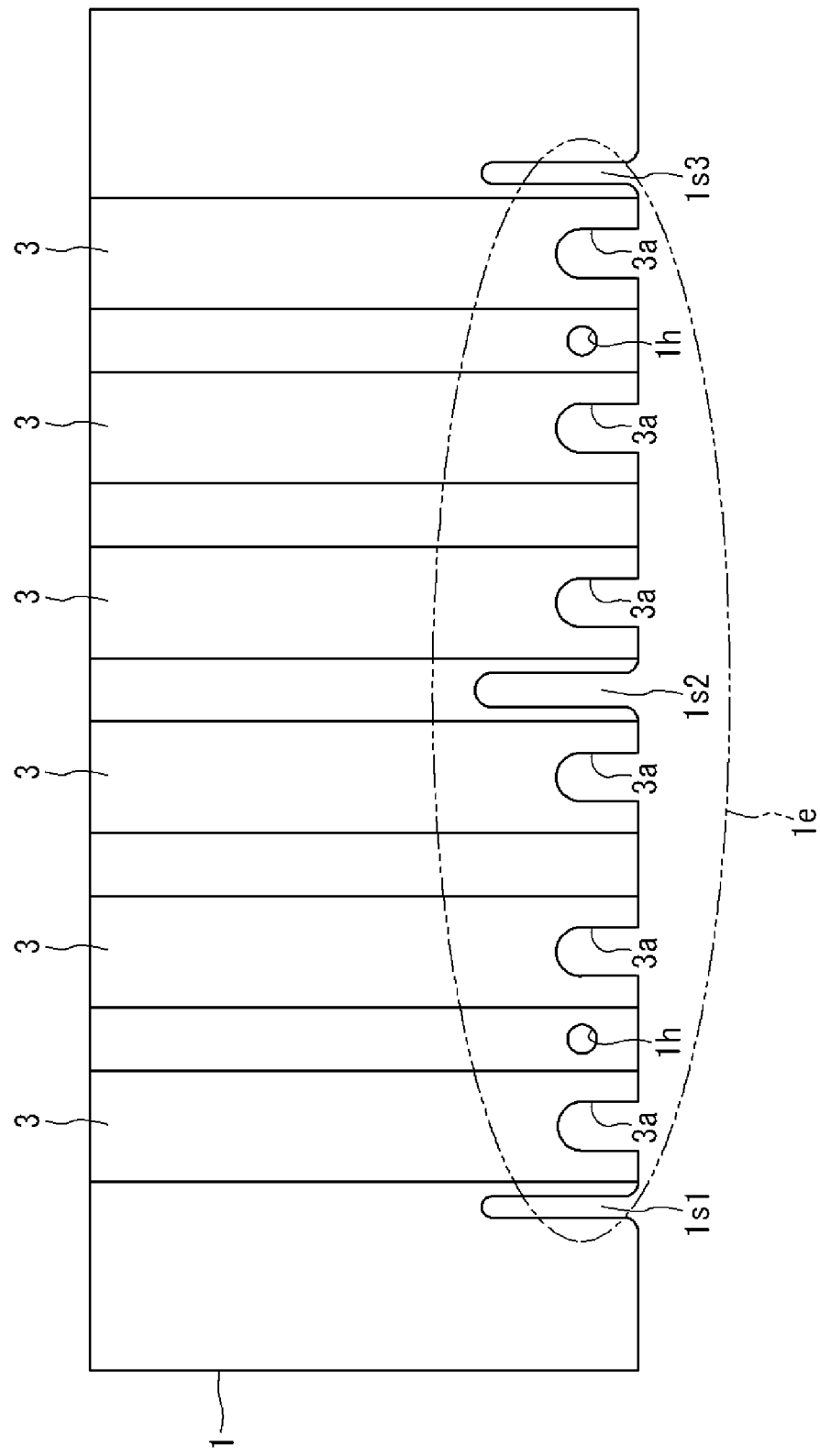
FIG. 17 is a plan view illustrating another example of the printed circuit board.

FIG. 17 is a plan view illustrating another example of the printed circuit board. The difference from the printed circuit board in FIG. 6 is that the hole 3a provided in the pattern 3 has an elongated U shape with an open end. This makes it possible to insert the insertion portion 1e of the printed circuit board 1 into the space 21s of the terminal block 2 simply by loosening the screw 22 without removing the screw 22.

<<Others>>

In the above embodiments, the terminal block 2 has the plurality (six pieces) of terminals 2t, but the number of terminals is not limited to six. Alternatively, the number of terminals may be one (one piece).

The shape of the pattern 3 in the above embodiments is merely an example for explanation, and there are patterns of various other shapes.

Although the conducting plate 24 is used in the connection structure in the above embodiments, it is possible to omit the conducting plate. For example, the structure may be such that the crimp terminal is brought into direct contact with and screwed to the pattern 3 of the printed circuit board 1 into which the terminal block 2 is inserted.

Even in the case where the conducting plate is provided, the shape of the conducting plate is not limited to those illustrated in, for example, FIGS. 9 and 10. For example, the conducting plate may include a plate-shaped simple conducting portion, only include the U-shaped portion of the conducting portion 24a, or include the conducting portion 24a and only one of the upper and lower support portions.

<<Summary of Disclosure>>

As described above, the summary of the disclosure can be expressed as follows, for example.

The connection structure between the printed circuit board and the terminal block according to this disclosure includes: the printed circuit board 1 in which the pattern 3 is drawn out near the end portion serving as the insertion portion 1e; the terminal-block main body 21 having the space 21s serving as the receiving port for the insertion portion 1e; the nut 23 held in the terminal-block main body 21; and the screw 22 tightened into the nut 23 with the pattern 3 interposed between the screw 22 and the nut 23 while the insertion portion 1e is inserted into the space 21s.

In the connection structure between the printed circuit board and the terminal block as described above, the insertion portion 1e is inserted into the space 21s of the terminal-block main body 21, whereby the terminal block 2 can be attached to the printed circuit board 1. The terminal block 2 can be reliably fixed to the printed circuit board 1 by the screw 22 being tightened into the nut 23. The electric wire can be connected to the terminal block 2 with the core wire or the crimp terminal inserted under the screw.

A better structure can be provided in this manner, from the viewpoints of work efficiency, reliable attachment, cost, and compactness, when the terminal block 2 is attached to the printed circuit board 1.

In the above connection structure between the printed circuit board and the terminal block, for example, the hole 3a is formed in the pattern 3, and the screw 22 is tightened into the nut 23 through the hole 3a.

In this case, the printed circuit board 1 and the terminal block 2 can be reliably fixed to each other. The presence of the hole 3a also facilitates positioning.

In the connection structure between the printed circuit board and the terminal block, for example, the conducting plate 24 can be provided. The conducting plate 24 is a member that is provided in each of the terminals 2t, has the hole 24d through which the screw 22 passes, and is in direct contact with the pattern 3.

In this case, the electric wire can be connected to the terminal block 2 with the core wire or the crimp terminal inserted between the screw 22 and the conducting plate 24.

In the above connection structure between the printed circuit board and the terminal block, for example, the conducting plate 24 is an elastic body that integrally includes, in relation to the axial direction of the screw 22 and the orthogonal direction orthogonal to the axial direction: the first support portion 24c inserted into the terminal-block main body 21 in the axial direction; the conducting portion 24a that extends in the orthogonal direction from the base end portion 24c2 on the opposite side of the tip end portion 24c1 of the first support portion 24c inserted into the terminal-block main body 21, is interposed between the pattern 3 and the nut 23, folded back in a U shape, and interposed between the pattern 3 and the head of the screw 22; and the second support portion 24b extending from the end portion 24a1 of the conducting portion 24a in the direction opposite to the insertion direction of the first support portion 24c.

In this case, when the terminal block 2 is attached to the printed circuit board 1 with all the screws 22 removed from the terminal block 2, the elasticity of the U-shaped conducting portion 24a can give a certain inserted feeling and the lower support portion 24c can suppress the detachment of the terminal block even before the screw 22 is tightened.

In the above connection structure between the printed circuit board and the terminal block, for example, the retaining projection 24e is formed on each of the side end faces of the support portion 24c.

In this case, it is possible to suppress the detachment of the conducting plate 24 from the terminal-block main body 21 by, for example, the support portion 24c being caught on the terminal-block main body 21.

In the above connection structure between the printed circuit board and the terminal block, for example, the terminal-block main body 21 is provided with the engaging piece 21e that engages with the printed circuit board 1 to prevent the printed circuit board 1 from coming off.

In this case, simply inserting the terminal block 2 into the printed circuit board 1 makes it possible to prevent the printed circuit board 1 from coming off even before the screw 22 is tightened (temporary fixing).

In the above connection structure between the printed circuit board and the terminal block, for example, the spacer 4 is provided between the printed circuit board 1 and the installation surface F below the printed circuit board 1, and the height of the spacer 4 is equal to the height dimension from the installation surface F to the lower side of the receiving port (space 21s).

In this case, even if the screw 22 is pushed and turned to connect an electric wire to the terminal block 2, the force applied to the printed circuit board 1 can be suppressed.

In the above connection structure between the printed circuit board and the terminal block, the slits 1s1, 1s3, and 1s2 are provided on the printed circuit board 1 while the side walls 21w1 and 21w3 and the central wall 21w2 are provided on the terminal block 2 for positioning. However, such positioning can be modified in various ways. Generally, one of the recess and the protrusion needs to be formed in the insertion portion 1e of the printed circuit board 1, while the other one of the recess and the protrusion needs to be formed at the corresponding position on the terminal-block main body 21.

This facilitates the positioning at the time of inserting the terminal block 2 into the printed circuit board 1.

Meanwhile, the present disclosure is, when expressed as a terminal block, the terminal block to be connected to the printed circuit board 1 in which the pattern 3 is drawn out near the end portion serving as the insertion portion 1e, the terminal block including: the terminal-block main body 21 having the space 21s serving as the receiving port for the insertion portion 1e; the nut 23 held in the terminal-block main body 21; and the screw 22 tightened into the nut 23 with the pattern 3 interposed between the screw 22 and the nut 23 while the insertion portion 1e is inserted into the space 21s.

In the terminal block 2 as described above, the insertion portion 1e is inserted into the space 21s of the terminal-block main body 21, whereby the terminal block 2 can be attached to the printed circuit board 1. The terminal block 2 can be reliably fixed to the printed circuit board 1 by the screw 22 being tightened into the nut 23. The electric wire can be connected to the terminal block 2 with the core wire or the crimp terminal inserted under the screw.

A terminal block having a better structure can be provided in this manner, from the viewpoints of work efficiency, reliable attachment, cost, and compactness, when the terminal block 2 is attached to the printed circuit board 1.

From the viewpoint as a part of the air conditioner, the air conditioner 100, in which the terminal block 2 for connecting the electric wire is connected to the printed circuit board 1, includes, as the connection structure between the printed circuit board and the terminal block: the printed circuit board 1 in which the pattern 3 is drawn out near the end portion serving as the insertion portion 1e; the terminal-block main body 21 having the space 21s serving as the receiving port for the insertion portion 1e; the nut 23 held in the terminal-block main body 21; and the screw 22 tightened into the nut 23 with the pattern 3 interposed between the screw 22 and the nut 23 while the insertion portion 1e is inserted into the space 21s.

In the air conditioner 100 as described above, the insertion portion 1e is inserted into the space 21s of the terminal-block main body 21, whereby the terminal block 2 can be attached to the printed circuit board 1. The terminal block 2 can be reliably fixed to the printed circuit board 1 by the screw 22 being tightened into the nut 23. The electric wire can be connected to the terminal block 2 with the core wire or the crimp terminal inserted under the screw.

A better structure can be provided in the air conditioner 100 in this manner, from the viewpoints of work efficiency, reliable attachment, cost, and compactness, when the terminal block 2 is attached to the printed circuit board 1.

Although the disclosure has been described with respect to only a limited number of embodiments, those skilled in the art, having benefit of this disclosure, will appreciate that various other embodiments may be devised without departing from the scope of the present disclosure. Accordingly, the scope of the present disclosure should be limited only by the attached claims

REFERENCE SIGNS LIST

1: PRINTED CIRCUIT BOARD
1e: INSERTION PORTION
1s1, 1s2, 1s3: SLIT
1h: HOLE
2: TERMINAL BLOCK
2t: TERMINAL
3: PATTERN
3a: HOLE
4: SPACER
5: CRIMP TERMINAL
21: TERMINAL BLOCK MAIN BODY
21c: RECESS
21d: HOLDING HOLE
21e: ENGAGING PIECE
21g: GROOVE
21p: PARTITION WALL
21s: SPACE

21s1: LOWER SIDE OF RECEIVING PORT
21w1, 21w3: SIDE WALL
21w2: CENTRAL WALL
22: SCREW
22w: SQUARE WASHER
23: NUT
24: CONDUCTING PLATE
24a: CONDUCTING PORTION
24a1: END PORTION
24b, 24c: SUPPORT PORTION
24c1: TIP END PORTION
24c2: BASE END PORTION
24d: HOLE
24e: PROJECTION
24f: PROJECTION
100: AIR CONDITIONER
101: ELECTRIC COMPONENT ROOM

The invention claimed is:

1. A connection structure between a printed circuit board and a terminal block, the connection structure comprising:
an insertion portion at one end of the printed circuit board, wherein a surface of the insertion portion comprises a pattern;
a terminal-block main body comprising a receiving port that receives the insertion portion;
a nut held in the terminal-block main body;
an end portion of an electric wire or a crimp terminal attached to an electric wire; and
a screw that fixes the terminal-block main body to the printed circuit board upon being tightened into the nut, wherein
the pattern and one of the end portion or the crimp terminal are interposed between the screw and the nut when the insertion portion is inserted into the receiving port.

2. The connection structure according to claim 1, wherein the pattern comprises a hole, and
the screw is tightened into the nut through the hole.

3. The connection structure according to claim 2, further comprising:
a conducting plate comprising a hole through which the screw passes, wherein the conducting plate is in direct contact with the pattern.

4. The connection structure according to claim 1, further comprising:
a conducting plate comprising a hole through which the screw passes, wherein the conducting plate is in direct contact with the pattern.

5. The connection structure according to claim 1, wherein the terminal-block main body comprises an engaging piece that engages with the printed circuit board to prevent the printed circuit board from detaching from the terminal block.

6. The connection structure according to claim 1, wherein a spacer is disposed between the printed circuit board and an installation surface below the printed circuit board, and
a height of the spacer is equal to a height dimension from the installation surface to a lower side of the receiving port.

7. The connection structure according to claim 1, wherein the insertion portion comprises a first recess and a first protrusion and the terminal-block main body comprises a second recess that receives the first protrusion and a second protrusion that is inserted into the first recess.

8. A connection structure between a printed circuit board and a terminal block, the connection structure comprising:
an insertion portion at one end of the printed circuit board, wherein a surface of the insertion portion comprises a pattern;
a terminal-block main body comprising a receiving port that receives the insertion portion;
a nut held in the terminal-block main body;
a screw tightened into the nut, wherein the pattern is interposed between the screw and the nut when the insertion portion is inserted into the receiving port; and
a conducting plate having a hole through which the screw passes, the conducting plate being in direct contact with the pattern, wherein
the conducting plate is an elastic body that integrally comprises, in relation to an axial direction of the screw and an orthogonal direction orthogonal to the axial direction:
a first support that is inserted into the terminal-block main body in the axial direction;
a conducting portion that:
extends in the orthogonal direction from a base end of the first support that is opposite to a tip end of the first support,
is interposed between the pattern and the nut,
is folded back in a U shape, and
is interposed between the pattern and a head of the screw; and
a second support that extends from an end of the conducting portion in a direction opposite to an insertion direction of the first support.

9. The connection structure according to claim 8, wherein a side end surface of the first support comprises a retaining projection.

10. A terminal block that is connected to a printed circuit board on which a pattern is drawn out at an end portion that serves as an insertion portion, and to an end portion of an electric wire or a crimp terminal attached to an electric wire, the terminal block comprising:
a terminal-block main body comprising a receiving port that receives the insertion portion;
a nut held in the terminal-block main body; and
a screw that fixes the terminal-block main body to the printed circuit board upon being tightened into the nut, wherein the pattern and one of the end portion or the crimp terminal are interposed between the screw and the nut when the insertion portion is inserted into the receiving port.

11. An air conditioner in which a terminal block for connecting an electric wire is connected to a printed circuit board, the air conditioner comprising:
a connection structure between the printed circuit board and the terminal block, wherein
the connection structure comprises:
an insertion portion at one end of the printed circuit board, wherein a surface of the insertion portion comprises a pattern;
a terminal-block main body comprising a receiving port that receives the insertion portion;
a nut held in the terminal-block main body;
an end portion of an electric wire or a crimp terminal attached to an electric wire; and
a screw that fixes the terminal-block main body to the printed circuit board upon being tightened into the nut, wherein the pattern and one of the end portion or the crimp terminal are interposed between the screw and the nut when the insertion portion is inserted into the receiving port.

12. An air conditioner in which a terminal block for connecting an electric wire is connected to a printed circuit board, the air conditioner comprising:
  a connection structure between the printed circuit board and the terminal block, wherein
  the connection structure comprises:
    an insertion portion at one end of the printed circuit board, wherein a surface of the insertion portion comprises a pattern;
    a terminal-block main body comprising a receiving port that receives the insertion portion;
    a nut held in the terminal-block main body;
    a screw tightened into the nut, wherein the pattern is interposed between the screw and the nut when the insertion portion is inserted into the receiving port; and
    a conducting plate comprising a hole through which the screw passes, wherein
  the conducting plate is in direct contact with the pattern, the conducting plate is an elastic body that integrally comprises, in relation to an axial direction of the screw and an orthogonal direction orthogonal to the axial direction:
    a first support that is inserted into the terminal-block main body in the axial direction;
    a conducting portion that:
      extends in the orthogonal direction from a base end of the first support that is opposite to a tip end of the first support,
      is interposed between the pattern and the nut,
      is folded back in a U shape, and
      is interposed between the pattern and a head of the screw; and
    a second support that extends from an end of the conducting portion in a direction opposite to an insertion direction of the first support.

* * * * *